United States Patent
Tarui et al.

(10) Patent No.: US 9,075,742 B2
(45) Date of Patent: Jul. 7, 2015

(54) MEMORY DEVICE

(75) Inventors: Masaya Tarui, Kanagawa-ken (JP);
Tatsunori Kanai, Kanagawa-ken (JP);
Yutaka Yamada, Kanagawa-ken (JP);
Hideki Yoshida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 830 days.

(21) Appl. No.: 13/360,989

(22) Filed: Jan. 30, 2012

(65) Prior Publication Data

US 2012/0131418 A1    May 24, 2012

Related U.S. Application Data

(63) Continuation of application No. PCT/JP2009/065741, filed on Sep. 9, 2009.

(51) Int. Cl.
*G11C 29/00* (2006.01)
*G06F 11/10* (2006.01)
*G11C 29/04* (2006.01)

(52) U.S. Cl.
CPC .... *G06F 11/1048* (2013.01); *G11C 2029/0411* (2013.01)

(58) Field of Classification Search
CPC . G06F 3/0619; G06F 11/1048; H03M 13/159
See application file for complete search history.

(56) References Cited

U.S. PATENT DOCUMENTS

| | | | |
|---|---|---|---|
| 5,267,204 A | 11/1993 | Ashmore, Jr. | |
| 5,959,897 A * | 9/1999 | Chevallier et al. | 365/185.33 |
| 6,762,952 B2 | 7/2004 | Munden et al. | |
| 7,055,007 B2 * | 5/2006 | Flautner et al. | 711/156 |
| 2009/0193319 A1 * | 7/2009 | Shen et al. | 714/777 |
| 2009/0213673 A1 * | 8/2009 | Flautner et al. | 365/203 |

(Continued)

FOREIGN PATENT DOCUMENTS

| | | |
|---|---|---|
| JP | 55-004757 | 1/1980 |
| JP | 55-080893 | 6/1980 |
| JP | 57-036680 | 2/1982 |

(Continued)

OTHER PUBLICATIONS

International Preliminary Report on Patentability for International Application No. PCT/JP2009/065741 issued on Apr. 11, 2012.

(Continued)

*Primary Examiner* — M. Mujtaba K Chaudry
(74) *Attorney, Agent, or Firm* — Amin, Turocy & Watson, LLP

(57) ABSTRACT

According to one embodiment, a memory device comprises a writing device that writes data bits, check bits for error corrections, and overhead bit(s) into a memory, each bit of the overhead bit(s) corresponding to each group of bit group(s) including at least one bit of the data bits and/or the check bits, each bit of the overhead bit(s) indicating whether the corresponding bit group has been inverted, a reading unit that reads the data bits, the check bits, and the overhead bit(s) from the memory, a correcting unit that corrects an error in the data bits and overhead bit(s) read from the memory, based on the check bits, and an inverting unit that inverts the data bits contained in the bit group corresponding to the overhead bit and outputs the inverted data bits as data read from the memory when the error-corrected overhead bit indicates that inversion has been performed.

7 Claims, 10 Drawing Sheets

(56) References Cited

U.S. PATENT DOCUMENTS

2009/0319865 A1    12/2009    Kanai et al.
2009/0319867 A1    12/2009    Kanai

FOREIGN PATENT DOCUMENTS

| | | |
|---|---|---|
| JP | 01-295349 | 11/1989 |
| JP | 05-298894 | 11/1993 |
| JP | 06-214891 | 8/1994 |
| JP | 2004-030884 | 1/2004 |
| JP | 2004-031904 | 1/2004 |
| JP | 2009-048379 | 3/2009 |

OTHER PUBLICATIONS

Written Opinion for International Application No. PCT/JP2009/065741.

International Search Report for International Application No. PCT/JP2009/065741 mailed on Dec. 22, 2009.

\* cited by examiner

MEMORY DEVICE

CROSS REFERENCE TO RELATED APPLICATIONS

This application is based on the International Application No. PCT/JP2009/065741, filed on Sep. 9, 2009, the entire contents of which are incorporated herein by reference.

FIELD

Embodiments described herein relate generally to a memory device.

BACKGROUND

In highly-integrated memory chips, defective memory cells that do not perform a desired operation exist due to variations of processing accuracy at the time of manufacture of individual memory cells (1-bit memory elements). Therefore, in a read-only memory such as a ROM or a PROM, when a defective memory cell that is capable of storing only either "0" or "1" is made to store a value that cannot be stored in the defective memory cell, the value of each data bit in the bit sequence is inverted and stored, and an additional memory component stores the information indicating that the data has been inverted. At the time of data reading, the information stored in the additional memory component is referred to. If the information indicates that the data has been inverted at the time of data storage, the read data is inverted before use.

In a MRAM or ReRAM, each memory cell is in a low-resistance state or a high-resistance state, and data is stored by associating one of the states with the logical value "0" and the other one of the states with the logical value "1." At the time of data reading in such a MRAM or ReRAM, a check is made to determine whether the logical value is "0" or "1" (or "1" or "0"), based on whether the resistance value of the memory cell is smaller or larger than a threshold value.

In such a memory, a defective memory cell that has a resistance value smaller (or larger) than the threshold value may exist, regardless of whether the defective memory cell is in a low-resistance state or a high-resistance state. Therefore, either "0" or "1" is invariably read from such a defective memory cell, regardless of whether "0" is written or whether "1" is written.

To recover defective memory cells of a memory with a high error rate such as a MRAM or a NAND flash memory, the use of an error correcting code (ECC) is insufficient. Therefore, an additional memory component has been suggested as in the above described conventional technique. However, when a value is incorrectly read from the additional memory component, the read data is wrongly inverted, and an error correction with an ECC cannot be performed. As a result, the reliability of read data is decreased.

DETAILED DESCRIPTION

According to one embodiment, a memory device comprises a writing device that writes data bits (i (i being an integer equal to or greater than 2) data bits), check bits (j (j being an integer equal to or greater than 2) check bits) for error corrections, and k (k being an integer equal to or greater than 1) overhead bit(s) into a memory, each bit of the k overhead bit(s) corresponding to each group of k bit group(s) including at least one bit of the data bits and/or the check bits, each bit of the k overhead bit(s) indicating whether the corresponding bit group has been inverted, a reading unit that reads the data bits, the check bits, and the overhead bit(s) from the memory, a correcting unit that corrects an error in the data bits and the overhead bit(s) read from the memory, based on the check bits read from the memory, and an inverting unit that inverts the data bits contained in the bit group corresponding to the overhead bit and outputs the inverted data bits as data read from the memory when the error-corrected overhead bit indicates that inversion has been performed, and does not invert the data bits contained in the bit group corresponding to the overhead bit and outputs the data bit as the data read from the memory when the error-corrected overhead bit indicates that inversion has not been performed.

Embodiments will now be explained with reference to the accompanying drawings.

First Embodiment

Figure 1:
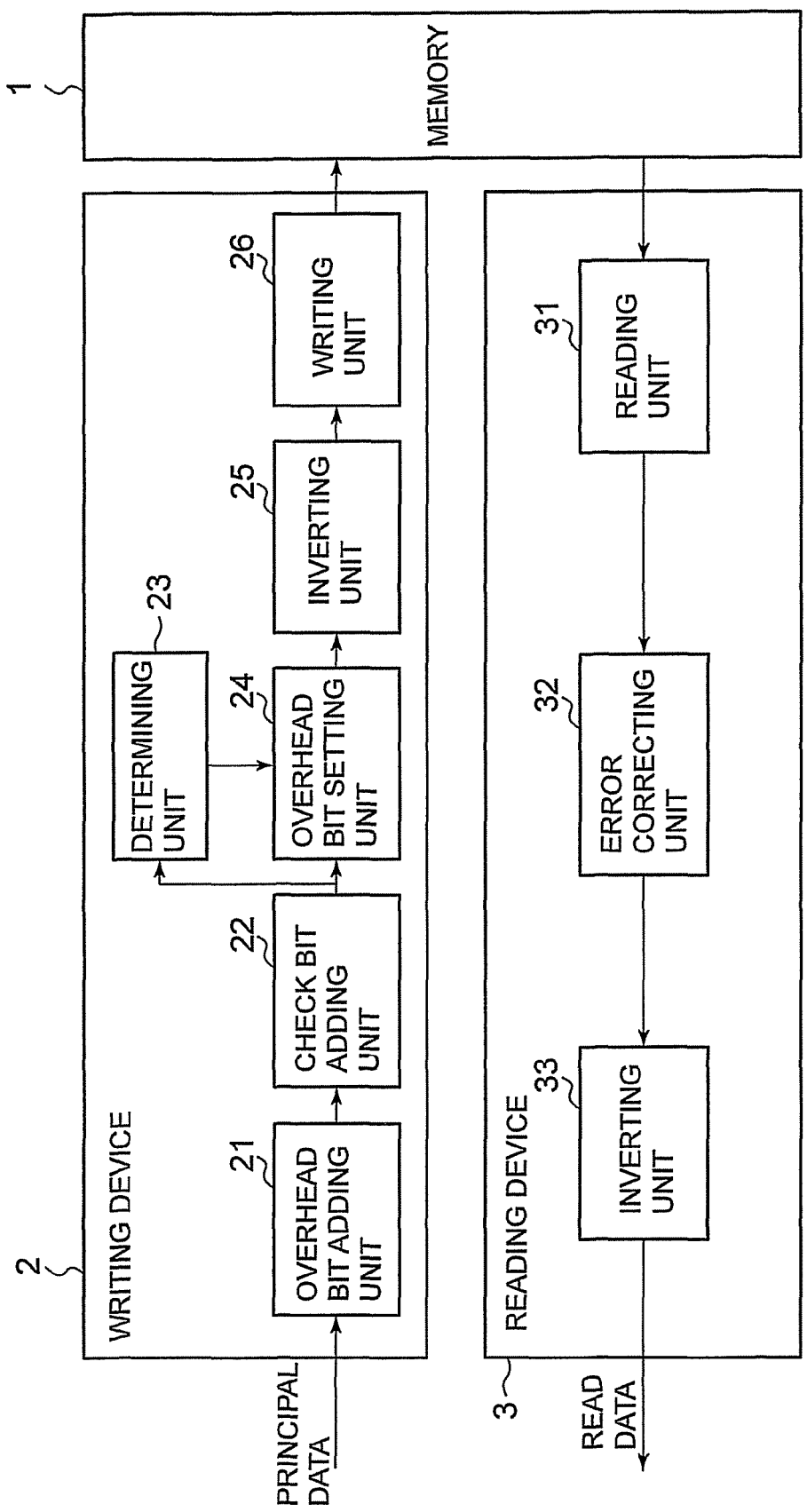
FIG. 1 is a block diagram of a memory device according to a first embodiment.

FIG. 1 schematically shows the structure of a memory device according to a first embodiment of the present invention. The memory device includes a memory 1, a writing device 2 that writes data into the memory 1, and a reading device 3 that reads data from the memory 1.

The writing device 2 includes an overhead bit adding unit 21, a check bit adding unit 22, a determining unit 23, an overhead bit setting unit 24, an inverting unit 25, and a writing unit 26.

The overhead bit adding unit 21 receives multiple data bits (hereinafter referred to as principal data) as data to be written into the memory 1. The overhead bit adding unit 21 adds an overhead bit consisting of one or more bits to the higher bit side of the input principal data. The overhead bit indicates whether the data on the lower side of the overhead bit is to be inverted at the inverting unit 25.

The value of the overhead bit to be added at the overhead bit adding unit 21 can be set in advance. For example, where 5-bit principal data {x0, x1, x2, x3, x4} is given to the overhead bit adding unit 21, the overhead bit adding unit 21 adds a one overhead bit {a0} to the 5-bit principal data, and outputs 6-bit data {a0, x0, x1, x2, x3, x4}.

The overhead bit can be changed to a different value by the overhead bit setting unit 24 in the later stage.

The check bit adding unit 22 calculates check bits from the overhead bit and the principal data, and adds the check bits to the lower bit side of the principal data. Here, the check bits are redundant bits added for an error correction with a linear code such as a hamming code.

For example, the check bit adding unit 22 calculates four check bits $\{c0, c1, c2, c3\}$ for error-correcting the 6-bit data $\{a0, x0, x1, x2, x3, x4\}$, and added the four check bits to the 6-bit data, to output 10-bit data $\{a0, x0, x1, x2, x3, x4, c0, c1, c2, c3\}$.

At this point, the check bits are determined by the following calculations: $c0=x0+x1+x2$, $c1=x0+x3+x4$, $c2=x1+x3+a0$, and $c3=x2+x4+a0$. All the calculations are modulo 2 operations.

The determining unit 23 counts "0s" or "1s" contained in the overhead bit, the principal data, and the check bits. Based on the count value and the characteristics of the memory 1, the determining unit 23 determines whether to invert the overhead bit, the principal data, and the check bits.

In a case where the memory 1 is an electrically rewritable MRAM that uses memory cells capable of having two different resistance values, for example, each memory cell is in a low-resistance state or a high-resistance state, and data is stored by associating the logical value "0" to one of the states and the logical value "1" to the other one of the states. When data is read out, a check is made to determine whether the logical value is "0" or "1" (or whether the logical value is "1" or "0"), based on whether the resistance value of the subject memory cell is smaller or larger than a threshold value.

In a MRAM, the same operation is performed for both reading and writing, and reading is performed at such intensity that the contents of the memory are not rewritten. For example, at the time of reading, a current is applied in the same direction as the direction in which a current flows when "0" is written, and a check is made to determine whether the logical value is "0" or "1," based on the resistance value at that point. The contents of the memories determined to have "1" might be rewritten to be "0," and so-called "read disturb" might occur.

In a conventional MRAM, the direction in which a current is applied at the time of reading is fixed in accordance with the device characteristics in the stage of design. Therefore, in a case where a current is applied, at the time of reading, in the same direction as the direction in which a current is applied when "0" is written, read disturb occurs only when recorded data "1" is rewritten to be "0." Therefore, when data is written into the memory, writing is performed so that the number of bits having the value "0" becomes larger. In this manner, the number of bits subjected to read disturb becomes smaller, and the probability of read disturb becomes lower in total.

Taking the memory characteristics into account, the determining unit 23 determines whether to invert the overhead bit, the principal data, and the check bits so that the bits to be subjected to read disturb are reduced. For example, in a case where read disturb to change "1" to "0" occurs in the memory 1, the determining unit 23 counts the number of bits having the value "1" among the overhead bit, the principal data, and the check bits. If the count value is equal to or greater than half the total bits of the overhead bit, the principal data, and the check bits, the determining unit 23 determines to perform inversion. If the count value is less than half the total number of bits of the overhead bit, the principal data, and the check bits, the determining unit 23 determines not to perform inversion.

The determining unit 23 notifies the overhead bit setting unit 24 of the determination result.

Based on the determination result sent from the determining unit 23, the overhead bit setting unit 24 sets a value for the overhead bit If the notified determination result indicates that inversion is to be performed, the overhead bit setting unit 24 changes the overhead bit to such a value that the principal data and the check bits are inverted at the inverting unit 25.

If the overhead bit indicates that data inversion is to be performed, the inverting unit 25 inverts the principal data and the check bits. If the overhead bit indicates that data inversion is not to be performed, the inverting unit 25 outputs the provided data as it is.

Figure 2:
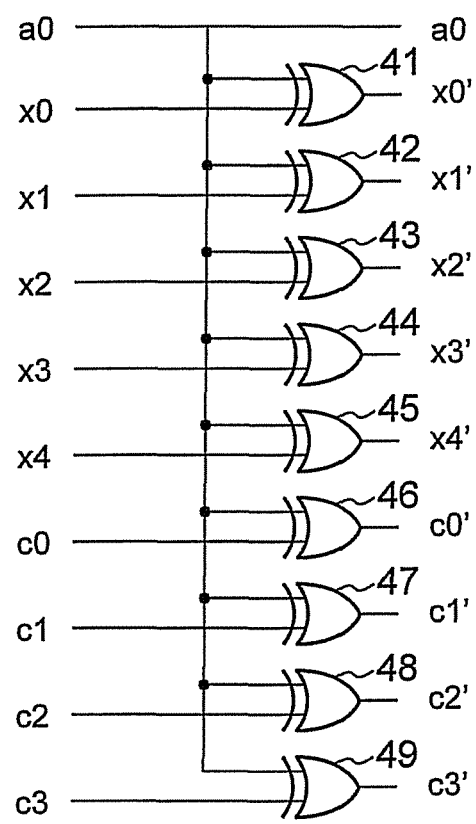
FIG. 2 is a schematic view showing the structure of the inverting unit in the writing device.

FIG. 2 shows an example structure of the inverting unit 25 that performs an inverting operation on the above described 10-bit data $\{a0, x0, x1, x2, x3, x4, c0, c1, c2, c3\}$. The inverting unit 25 includes nine XOR elements 41 through 49. Each of the XOR elements receives one of x0 through c3 and a0. For example, the XOR element 41 receives a0 and x0, and outputs x0'.

If a0 is "0," x0' through c3' that are output from the XOR elements 41 through 49 have the same values as x0 through c3. If a0 is "1," on the other hand, x0' through c3' that are output from the XOR elements 41 through 49 have the values obtained by inverting x0 through c3.

That is, in this example, the principal data and the check bits are inverted when the overhead bit a0 is "1," and the principal data and the check bits are output as they are when the overhead bit a0 is "0." Therefore, if the determination result sent from the determining unit 23 indicates that inversion is to be performed, the overhead bit setting unit 24 sets the overhead bit a0 to "1." If the determination result indicates that inversion is not to be performed, the overhead bit setting unit 24 sets the overhead bit a0 to "0."

The writing unit 26 writes the data output from the inverting unit 25 into the memory 1. For example, the writing unit 26 writes the 10-bit data $\{a0, x0', x1', x2', x3', x4', c0', c2', c3'\}$ output from the inverting unit 25 illustrated in FIG. 2, into the memory 1.

It should be noted that FIG. 1 does not show the address signal lines indicating data write destinations and read destinations of the memory 1, the control signal lines indicating the timings to perform writing and reading, and the like.

The reading device 3 includes a reading unit 31, an error correcting unit 32, and an inverting unit 33.

The reading unit 31 reads data from the memory 1. The data read by the reading unit 31 includes an overhead bit, principal data, and check bits, like the data to be written into the memory 1 by the writing unit 26.

The error correcting unit 32 performs syndrome calculations on the data read by the reading unit 31, and detects whether there is an error in the principal data and the overhead bit. If there is an error detected, the error correcting unit 32 corrects the error.

Figure 3:
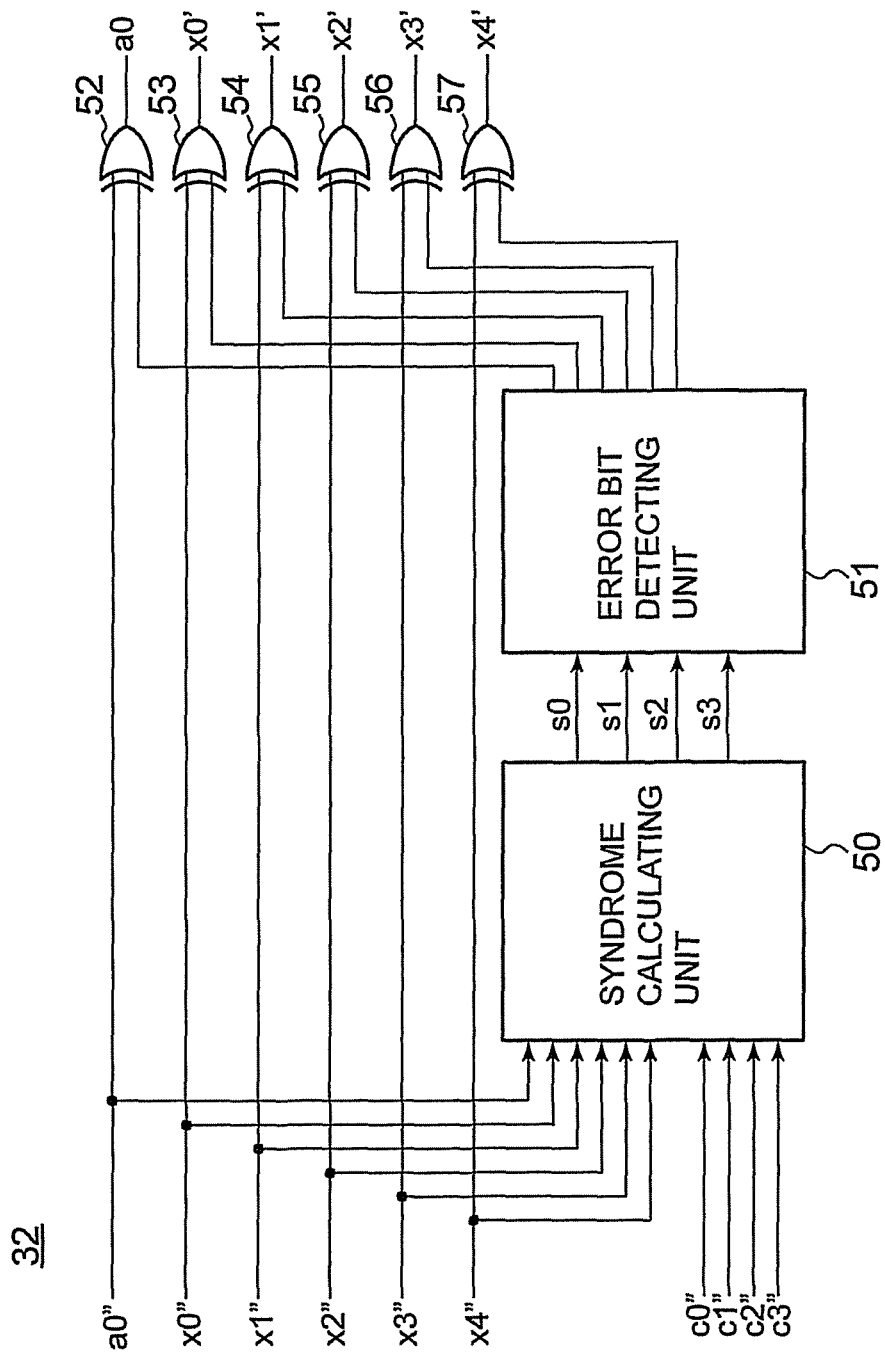
FIG. 3 is a schematic view showing the structure of the error correcting unit.

FIG. 3 shows an example structure of the error correcting unit 32 in a case where the reading unit 31 is to read, from the memory 1, data $\{a0'', x0'', x1'', x2'', x3'', x4'', c0'', c1'', c2'', c3''\}$ corresponding to the 10-bit data $\{a0, x0', x1', x2', x3', x4', c0', c1', c2', c3'\}$ written by the writing unit 26. The error correcting unit 32 includes a syndrome calculating unit 50, an error bit detecting unit 51, and XOR elements 52 through 57.

Using the read data, the syndrome calculating unit 50 calculates syndromes $\{s0, s1, s2, s3\}$. The syndromes are determined by the following calculations: $s0=x0''+x1''+x2''+c0''$, $s1=x0''+x3''+x4''+c1''$, $s2=x1''+x3''+a0''+c2''$, and $s3=x2''+x4''+a0''+c3''$. All the calculations are modulo 2 operations.

Figure 4:
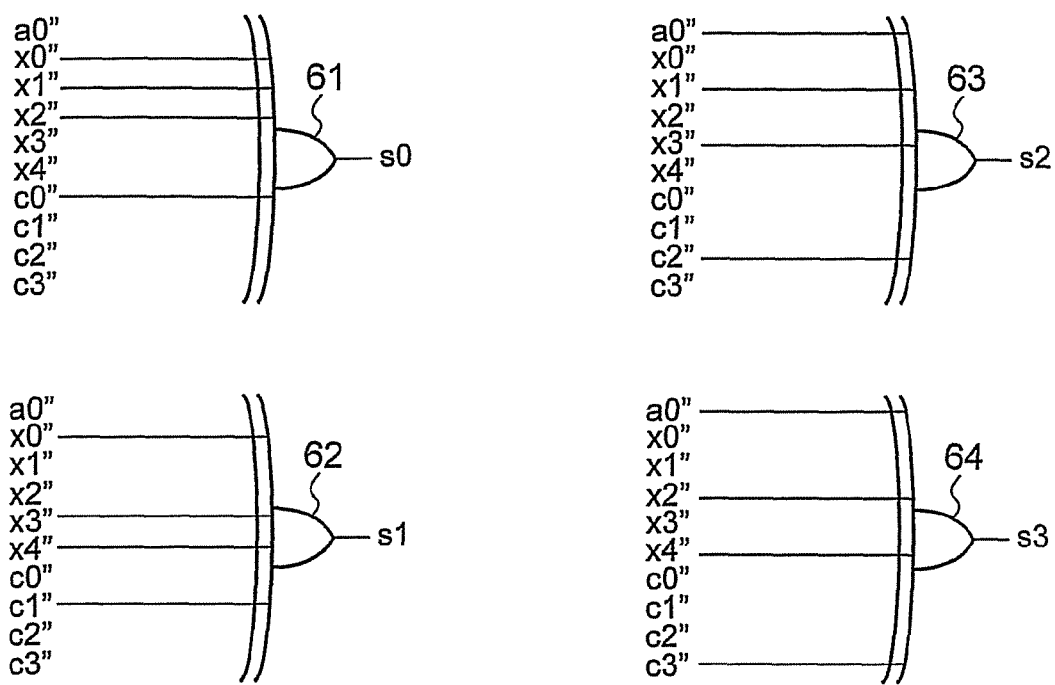
FIG. 4 is a schematic view showing the structure of the syndrome calculating unit.

The syndrome calculating unit 50 can be realized by the structure illustrated in FIG. 4. At this point, the number of pieces of data to be input to XOR elements 61 through 64 can be made an even number.

Based on the syndromes {s0, s1, s2, s3}, the error bit detecting unit 51 performs error bit detection. In a case where the syndromes indicate 1100, x0" is an error. Likewise, in a case where the syndromes indicate 1010, x1" is an error. In a case where the syndromes indicate 1001, x2" is an error. In a case where the syndromes indicate 0110, x3" is an error. In a case where the syndromes indicate 0101, x4" is an error. In a case where the syndromes indicate 0011, a0" is an error. In a case where the syndromes indicate 1000, c0" is an error. In a case where the syndromes indicate 0100, c1" is an error. In a case where the syndromes indicate 0010, c2" is an error. In a case where the syndromes indicate 0001, c3" is an error.

Figure 5:
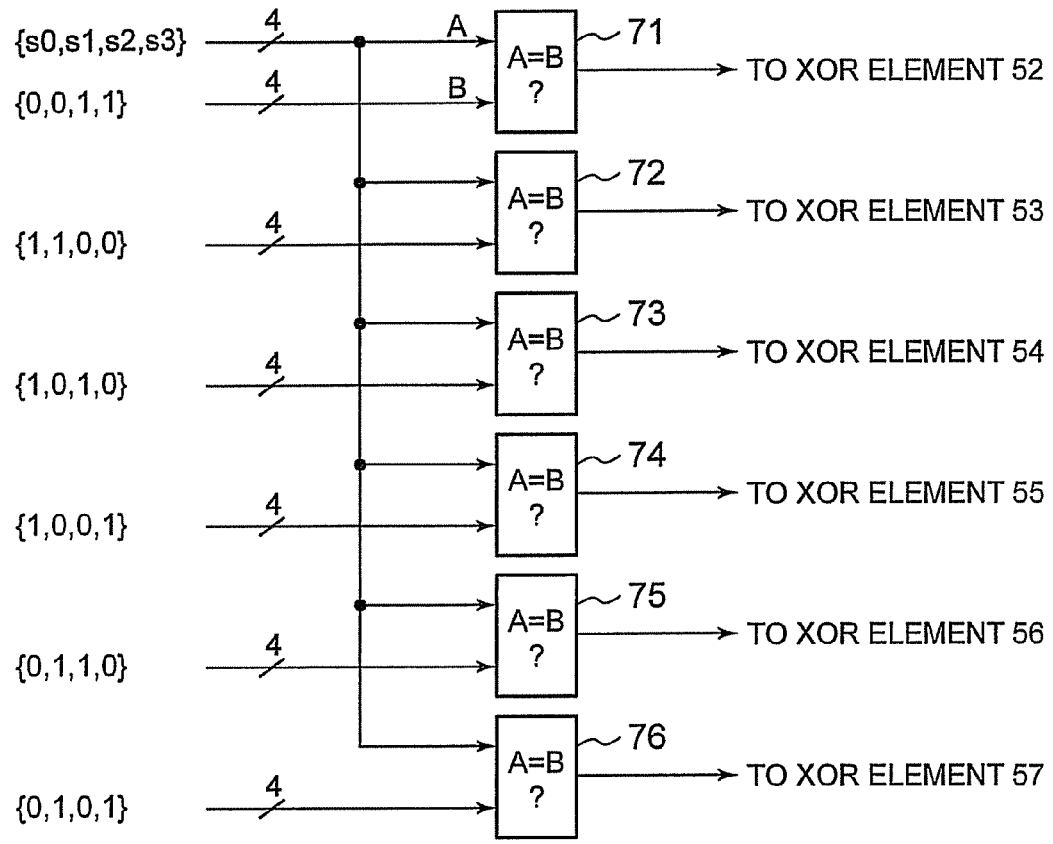
FIG. 5 is a schematic view showing the structure of the error bit detecting unit.

FIG. 5 shows an example structure of the error bit detecting unit 51. The error bit detecting unit 51 includes comparators 71 through 76. The comparator 71 compares the syndromes {s0, s1, s2, s3} with {0, 0, 1, 1}. If the syndromes are the same as {0, 0, 1, 1}, "1" is output to the XOR element 52. If not, "0" is output to the XOR element 52. When the comparison results indicate matching, a0" is an error. Therefore, "1" is output to the XOR element 52, to invert a0" and correct the error.

Likewise, the comparators 72 through 76 detect whether x0" through x4" are errors based on the syndromes {s0, s1, s2, s3}. If there are errors, the comparators 72 through 76 output "1" to the corresponding XOR elements 53 through 57, to correct the errors.

The 6-bit data {a0, x0', x1', x2', x3', x4'} output from the XOR elements 52 through 57 serves as the error-corrected overhead bit and principal data.

In accordance with the value of the overhead bit in the data output from the error correcting unit 32, the inverting unit 33 performs principal data inversion, and outputs the inverted data as read data.

Figure 6:
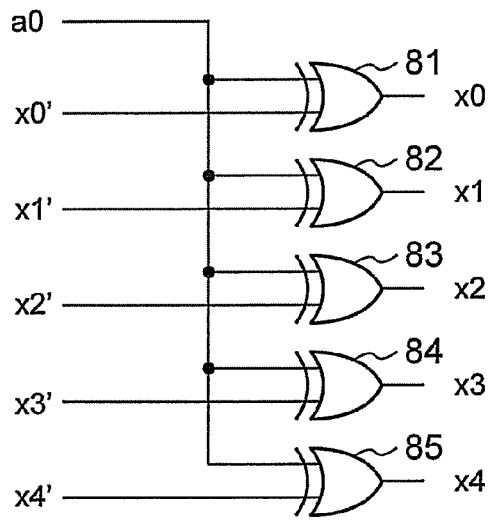
FIG. 6 is a schematic view showing the structure of the inverting unit in the reading device.

FIG. 6 shows an example structure of the inverting unit 33 in a case where the 6-bit data {a0, x0', x1', x2', x3', x4'} is output from the error correcting unit 32. The inverting unit 33 includes five XOR elements 81 through 85. Each of the XOR elements receives one of x0' through x4' and a0. For example, the XOR element 81 receives a0 and x0', and outputs x0.

If a0 is "0," x0 through x4 that are output from the XOR elements 81 through 85 have the same values as x0' through x4'. If a0 is "1," on the other hand, x0 through x4 that are output from the XOR elements 81 through 85 have the values obtained by inverting x0' through x4'.

Next, the operations of the respective components of the memory device are described through an example case where the 5-bit principal data {x0, x1, x2, x3, x4} is 00111.

The overhead bit adding unit 21 adds one overhead bit Here, "0" is added. Therefore, the overhead bit adding unit 21 outputs 000111.

The check bit adding unit 22 calculates the four check bits 1010 for 000111 according to the above calculation. The check bit adding unit 22 then outputs 0001111010.

The determining unit 23 counts the number of bits having the value "1" or "0," and, based on the characteristics of the memory 1, determines whether to perform data inversion. Here, the determining unit 23 determines to perform inversion, though the number of bits having the value "0" is the same as the number of bits having the value "1."

Based on the result of the determination performed by the determining unit 23, the overhead bit setting unit 24 changes the overhead bit value from "0" to "1." As a result of this, the overhead bit setting unit 24 outputs 1001111010, and inputs 1001111010 to the inverting unit 25 shown in FIG. 2.

Since the overhead bit is "1," the inverting unit 25 inverts the principal data portion (00111) and the check bit portion (1010). As a result of this, 1110000101 is output from the inverting unit 25 and this data is written into the memory 1 by the writing unit 26.

In a case where the reading unit 31 reads data from the memory 1 without an error, the read data is 11100001010. After the syndrome calculating unit 50 shown in FIG. 4 performs syndrome calculations on the data, the syndromes {s0, s1, s2, s3} become 0000, and it becomes clear that there are no errors. Accordingly, 111000 is output from the error correcting unit 32.

When 111000 is input to the inverting unit 33 shown in FIG. 6, the principal data portion (11000) is inverted, since the overhead bit is "1." Accordingly, 00111 is output as the read data. Here, it is apparent that the write data (the principal data) supplied to the writing device 2 is the same as the read data output from the reading device 3.

Next, a case where there is an error in data the reading unit 31 has read from the memory 1 is described. The data at the location of a0 is an error, and the data read by the reading unit 31 is 01100001010.

After the syndrome calculating unit 50 shown in FIG. 4 performs syndrome calculations on the read data, the syndromes {s0, s1, s2, s3} become 0011. The syndromes indicate that a0 is an error, and "1" is output from the comparator 71 of the error bit detecting unit 51 to the XOR element 52. As a result of this, the data at the location of a0 can be properly corrected, and 111000 is output from the error correcting unit 32. The procedures to be carried out thereafter are the same as those described above, and 00111 is output as the read data from the inverting unit 33. Here, it is apparent that the write data (the principal data) supplied to the writing device 2 is the same as the read data output from the reading device 3.

As described above, in this embodiment, an error correction is also performed on the overhead bit indicating whether to perform data inversion. Accordingly, inadvertent data inversion can be prevented at the time of data reading, and the reliability of the read data can be increased.

Also, data is inverted and stored into the memory 1 so that the number of bits having the value "1" or "0" becomes larger in accordance with the characteristics of the memory 1. Accordingly, the probability of read disturb can be decreased, and the reliability of the read data can be further increased.

Second Embodiment

Figure 7:
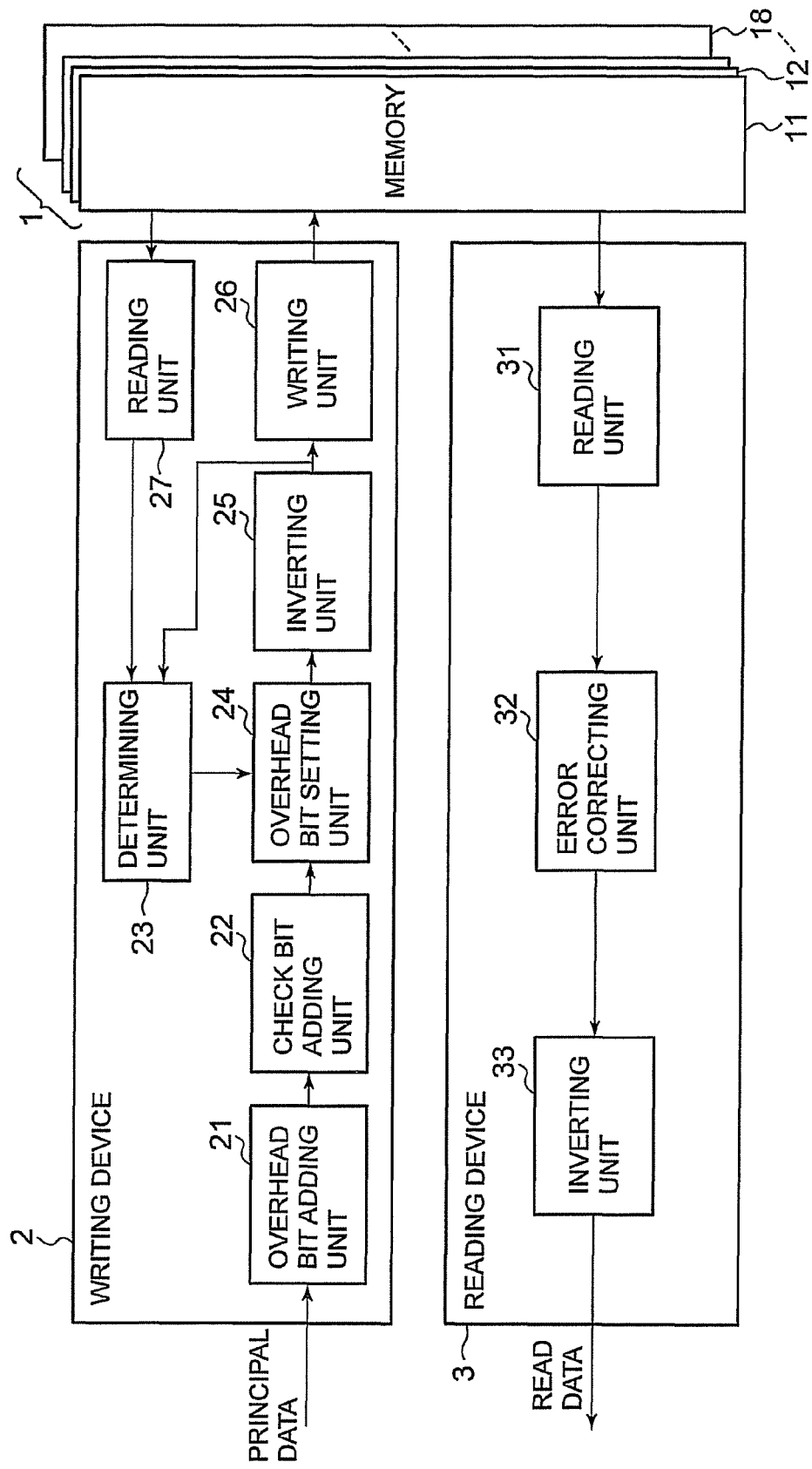
FIG. 7 is a block diagram of a memory device according to a second embodiment.

FIG. 7 schematically shows the structure of a memory device according to a second embodiment of the present invention. In this embodiment, the memory 1 includes plural storage areas (memory chips), and in the following description, the memory 1 includes eight storage areas 11 through 18. The writing device 2 further includes a reading unit 27, and the function of the determining unit 23 differs from that of the first embodiment. Other than those aspects, this embodiment is the same as the first embodiment illustrated in FIG. 1. In FIG. 7, the same components as those of the first embodiment illustrated in FIG. 1 are denoted by the same reference numerals as those used in FIG. 1, and explanation of them is not repeated here.

Figure 8:
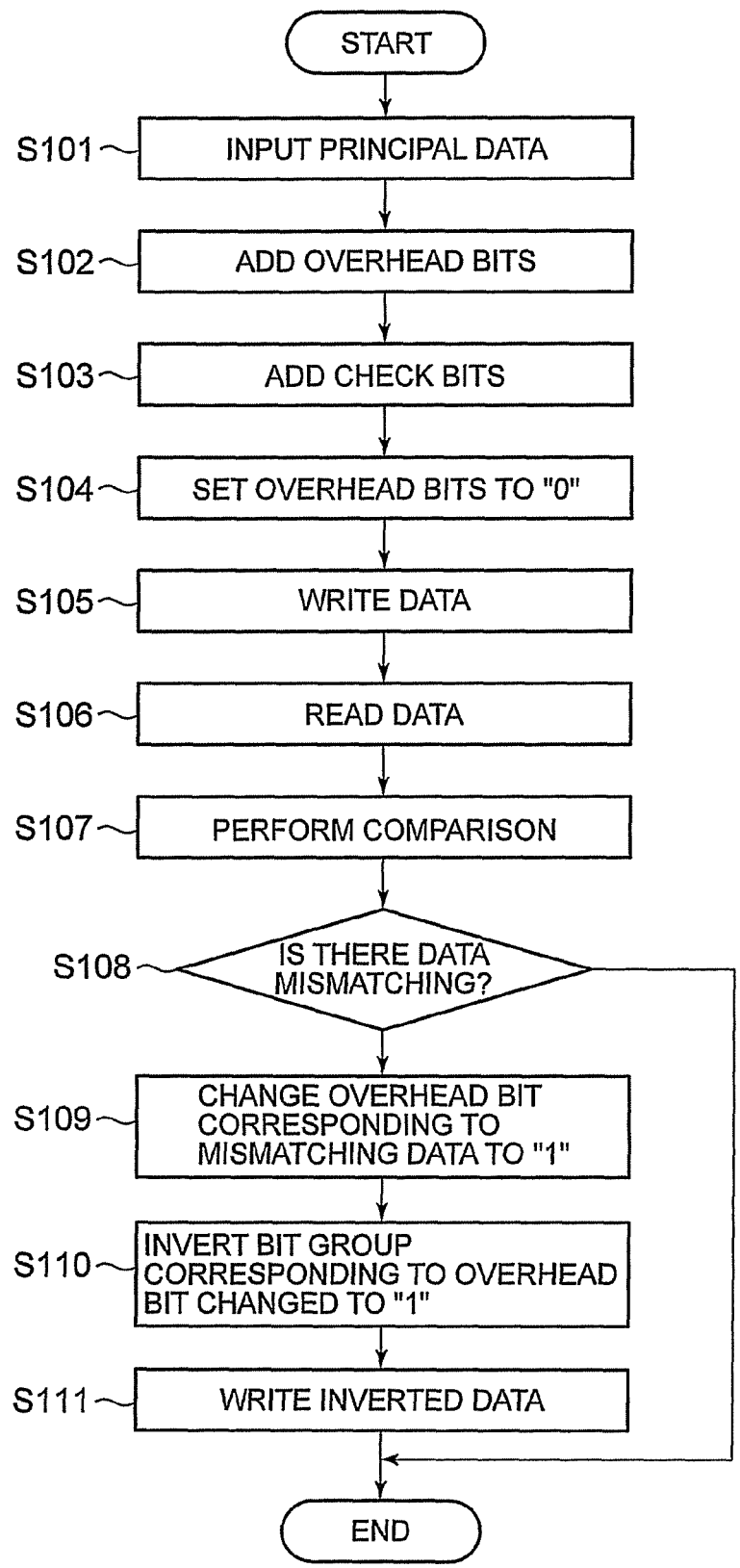
FIG. 8 is a flowchart for explaining a writing method.

Referring now to the flowchart shown in FIG. 8, an operation to be performed by the writing device 2 to write data into the memory 1 is described.

(Step S101) The principal data to be written into the memory 1 is input to the overhead bit adding unit 21 of the writing device 2. For example, 64-bit principal data {x0 through x63} is input to the overhead bit adding unit 21.

(Step S102) The overhead bit adding unit 21 adds a predetermined value consisting of one or more bits as the overhead bit(s) to the higher bit side of the principal data. For example, eight overhead bits {a0 through a7} are added to the higher bit side of the 64-bit principal data {x0 through x63}.

(Step S103) The check bit adding unit 22 calculates check bits from the overhead bits and the principal data, and adds the check bits to the lower bit side of the principal data. For example, for 72-bit data {a0 through a7, x0 through x63} consisting of the eight overhead bits {a0 through a7} and the 64-bit principal data {x0 through x63}, eight check bits {c0 through c7} for performing an error correction with an extended hamming code are calculated and added.

(Step S104) The overhead bit setting unit 24 sets all the overhead bits to "0."

(step S105) Since the overhead bits are "0", the inverting unit 25 does not perform inversion, and outputs the data to the writing unit 26.

The inverting unit 25 outputs the bit group corresponding to an overhead bit without inversion when the overhead bit has the value "0," and inverts and then outputs the bit group corresponding to an overhead bit when the overhead bit has the value "1."

The correspondence relationship between overhead bits and bit groups is now described. In a case where data contains k (k being an integer equal to or greater than 1) overhead bits, i-bit (i being an integer equal to or greater than 2) principal data, and j (j being an integer equal to or greater than 2) check bits, the respective overhead bits correspond to bit groups obtained by dividing the principal data and the check bits by k.

Figure 9:
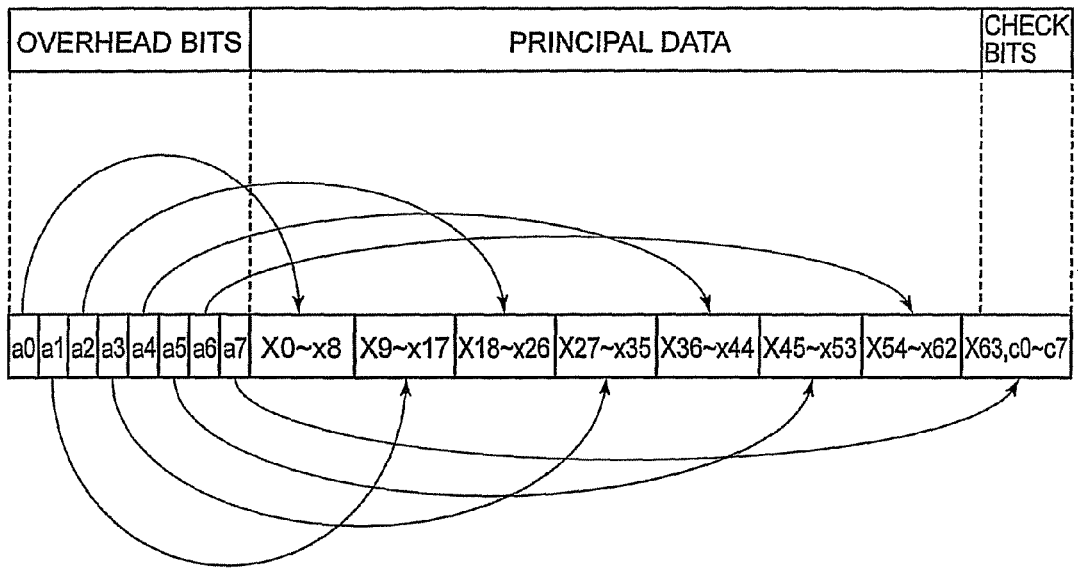
FIG. 9 is a diagram showing the correspondence relationship between overhead bits and bit groups.

For example, in a case where the write data is 80-bit data consisting of eight overhead bits {a0 through a7}, 64-bit principal data {x0 through x63}, and eight check bits {c0 through c7}, the correspondence relationship between the overhead bits and the bit groups is as shown in FIG. 9. That is, one overhead bit corresponds to a bit group consisting of 9-bit principal data and/or check bits. In that case, the inverting unit 25 has the structure shown in FIG. 10.

In the case of the 10-bit data {a0, x0, x1, x2, x3, x4, c0, c1, c2, c3} taken as an example in the first embodiment, the overhead bit a0 corresponds to the bit group consisting of the 5-bit principal data {x0, x1, x2, x3, x4} and the four check bits {c0, c1, c2, c3}.

The writing unit 26 writes the data output from the inverting unit 25, into the memory 1.

The writing unit 26 combines each overhead bit with the bit group corresponding to the overhead bit, and writes the combined data into one of the plural storage areas (memory chips). For example, the respective overhead bits and the corresponding bit groups are sequentially allocated to and written into the storage areas 11 through 18.

Figure 10:
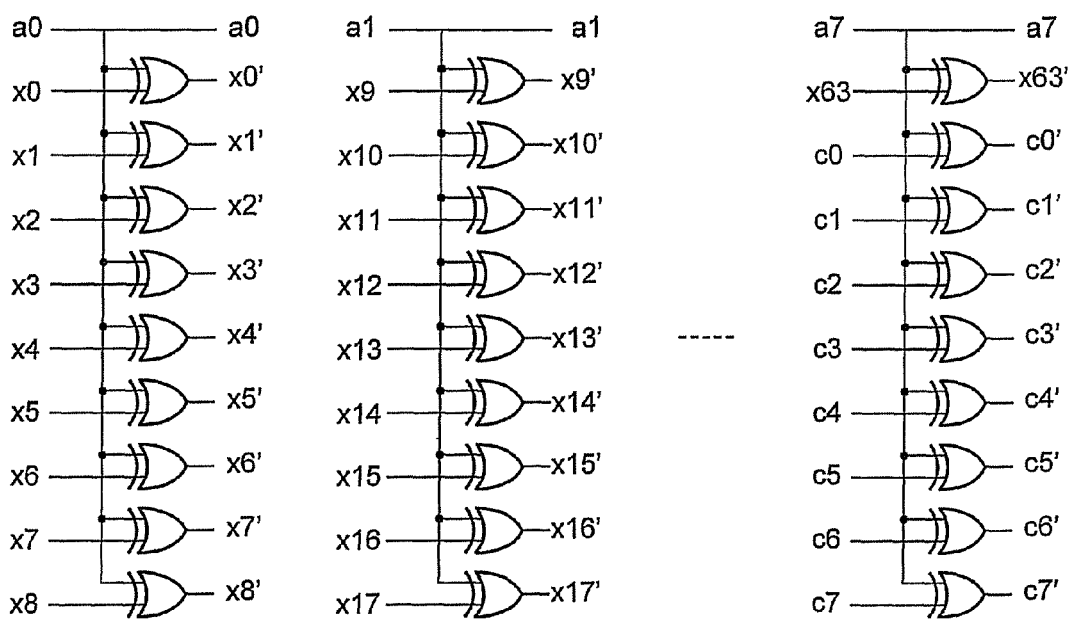
FIG. 10 is a schematic view showing the structure of the inverting unit in the writing device.

In the example case illustrated in FIGS. 9 and 10, the overhead bit a0 and the corresponding bit group consisting of x0' through x8' are written into the storage area 11.

(Step S106) The reading unit 27 reads the data written in step S105 from each storage area of the memory 1, and outputs the data to the determining unit 23.

(Step S107) The determining unit 23 compares the data written in step S105 with the data read out in step S106. The comparison is performed on each storage area, or on each combination of an overhead bit and a corresponding bit group.

(Step S108) If the comparison result shows that there is data mismatching, the operation moves on to step S109. If there is no data mismatching, the writing operation comes to an end. For example, in a case where "0" is written into a defective memory cell from which "1" is invariably read as the read data, the write data does not match the read data.

(Step S109) The overhead bit setting unit 24 changes the overhead bit corresponding to data that is determined to be mismatching data as a result of the comparison, to "1."

(Step S110) The inverting unit 25 inverts the bit group corresponding to the overhead bit changed from "0" to "1" in step S109, and outputs the inverted bit group to the writing unit 26.

(Step S111) The writing unit 26 writes the inverted overhead bit and bit group into the allocated storage area.

The operations to be performed by the respective components in an example case where x27 through x35 in the bit group corresponding to the overhead bit a3 are 010101010 are now described.

First, since the overhead bit setting unit 24 sets the overhead bit a3 to "0," the inverting unit 25 does not invert x27 through x35, and the writing unit 26 writes 0010101010 into the storage area 14.

In a case where the memory cell corresponding to the location of x29 in the storage area 14 is a defective memory cell from which "1" is invariably read, the data read by the reading unit 27 is 0011101010.

The determining unit 23 determines that the write data does not match the read data with respect to the data written in the storage area 14. The determining unit 23 then notifies the overhead bit setting unit 24 of the determination result.

Based on the result of the determination performed by the determining unit 23, the overhead bit setting unit 24 changes the overhead bit a3 from "0" to "1." Since the overhead bit a3 is "1," the inverting unit 25 inverts the corresponding bit group consisting of x27 through x35. As a result of this, the data to be written into the storage area 14 by the writing unit 26 becomes 1101010101. Accordingly, even if the memory cell corresponding to the location of x29 is a defective memory cell from which "1" is invariably read, the memory cell can function as a memory cell that holds a correct value.

The reading operation to be performed by the reading device 3 is the same as that described in the first embodiment. The error correcting unit 32 performs syndrome calculations on the data read by the reading unit 31, and detects whether there is an error in the principal data and the overhead bits. If there is an error, the error correcting unit 32 corrects the error.

In a case where the reading unit 31 reads 80-bit data {a0 through a7, x0 through x63, c0 through c7} consisting of eight overhead bits {a0 through a7}, 64-bit principal data {x0 through x63}, and eight check bits {c0 through c7}, the reading unit 31 performs the following syndrome calculations to calculate syndromes {s0 through s7}. All the calculations are modulo 2 operations.

$$s0 = x0+x4+x5+x6+x8+a0+x16+x17+x21+x24+x25+ \\ a2+x28+x29+x30+x31+x32+x34+x35+a3+x40+ \\ x43+x46+x47+x48+x51+x52+a5+x54+x56+x62+ \\ a6+x63+c0$$

$$s1 = x0+x1+x5+x8+x9+x13+x14+x15+x17+a1+x25+ \\ x26+x30+x33+x34+a3+x37+x38+x39+x40+x41+ \\ x43+x44+a4+x49+x52+x55+x56+x57+x60+x61+ \\ a6+x63+c1$$

$$s2 = x0+x2+x8+a0+x9+x10+x14+x17+x18+x22+x23+ \\ x24+x26+a2+x34+x35+x39+x42+x43+a4+x46+ \\ x47+x48+x49+x50+x52+x53+a5+x58+x61+c2+ \\ a7$$

$$s3 = x1+x2+x3+x6+x7+a0+x9+x11+x17+a1+x18+x19+\\x23+x26+x27+x31+x32+x33+x35+a3+x43+x44+\\x48+x51+x52+a5+x55+x56+x57+x58+x59+x61+\\x62+a6+c3+a7$$

$$s4 = x4+x7+x10+x11+x12+x15+x16+a1+x18+x20+\\x26+a2+x27+x28+x32+x35+x36+x40+x41+x42+\\x44+a4+x52+x53+x57+x60+x61+a6+c4+a7$$

$$s5 = x1+x2+x3+x4+x5+x7+x8+a0+x13+x16+x19+x20+\\x21+x24+x25+a2+x27+x29+x35+a3+x36+x37+\\x41+x44+x45+x49+x50+x51+x53+a5+x61+x62+\\c5+a7$$

$$s6 = x3+x6+x7+a0+x10+x11+x12+x13+x14+x16+x17+\\a1+x22+x25+x28+x29+x30+x33+x34+a3+x36+\\x38+x44+a4+x45+x46+x50+x53+x54+x58+x59+\\x60+x62+a6+c6+a7$$

$$s7 = x0+x1+x2+x3+x4+x5+x6+x7+x8+a0+x9+x10+\\x11+x12+x13+x14+x15+x16+x17+a1+x18+x19+\\x20+x21+x22+x23+x24+x25+x26+a2+x27+x28+\\x29+x30+x31+x32+x33+x34+x35+a3+x36+x37+\\x38+x39+x40+x41+x42+x43+x44+a4+x45+x46+\\x47+x48+x49+x50+x51+x52+x53+a5+x54+x55+\\x56+x57+x58+x59+x60+x61+x62+a6+x63+c0+\\c1+c2+c3+c4+c5+c6+c7+a7$$

Figure 11:
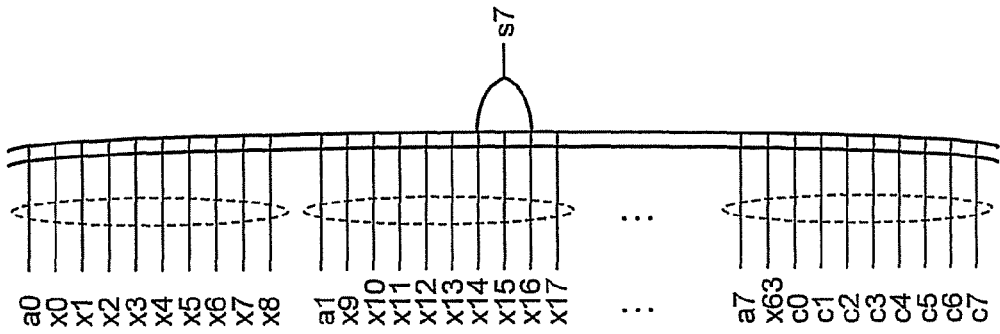
FIG. 11 is a schematic view showing the structure of the syndrome calculating unit.
Figure 11:
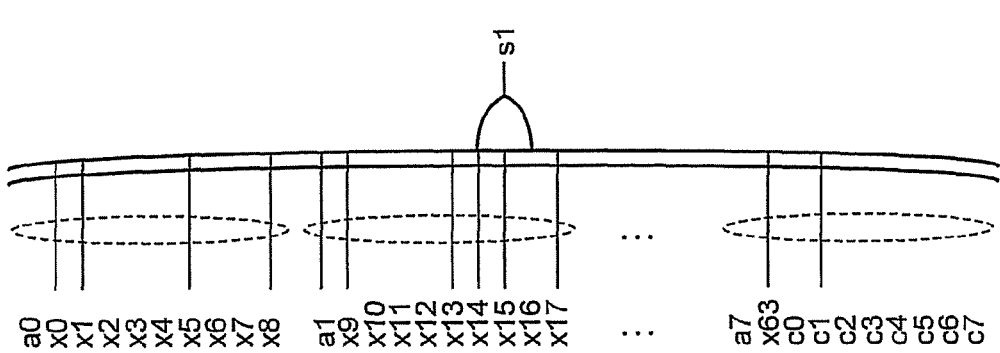
Figure 11:
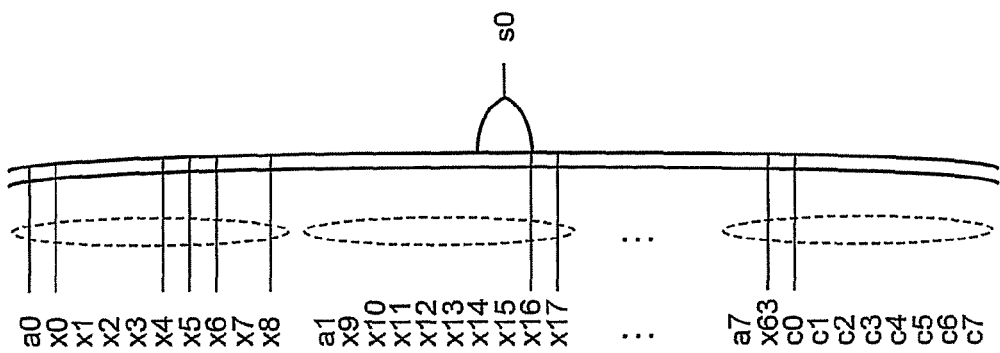

FIG. 11 illustrates an example structure of the syndrome calculating unit 50 that performs the above calculations. As can be seen from the drawing, an even number of pieces of data is provided to each of the plural XOR elements that constitute the syndrome calculating unit 50.

As described above, in this embodiment, an error correction is also performed on the overhead bits indicating whether to perform data inversion, as in the first embodiment. Accordingly, inadvertent data inversion can be prevented at the time of data reading, and the reliability of the read data can be increased.

Also, in this embodiment, the data written into the memory 1 is compared with the data read from the memory 1. If there is data mismatching, the data is inverted, and is then written again. Accordingly, a correct value can be read from a defective memory cell that is capable of storing only "0" or "1."

Also, in this embodiment, data re-writing is performed only on the storage area having mismatching read data among the plural storage areas. Accordingly, an increase in the period of time required for writing can be restrained.

Figure 12:
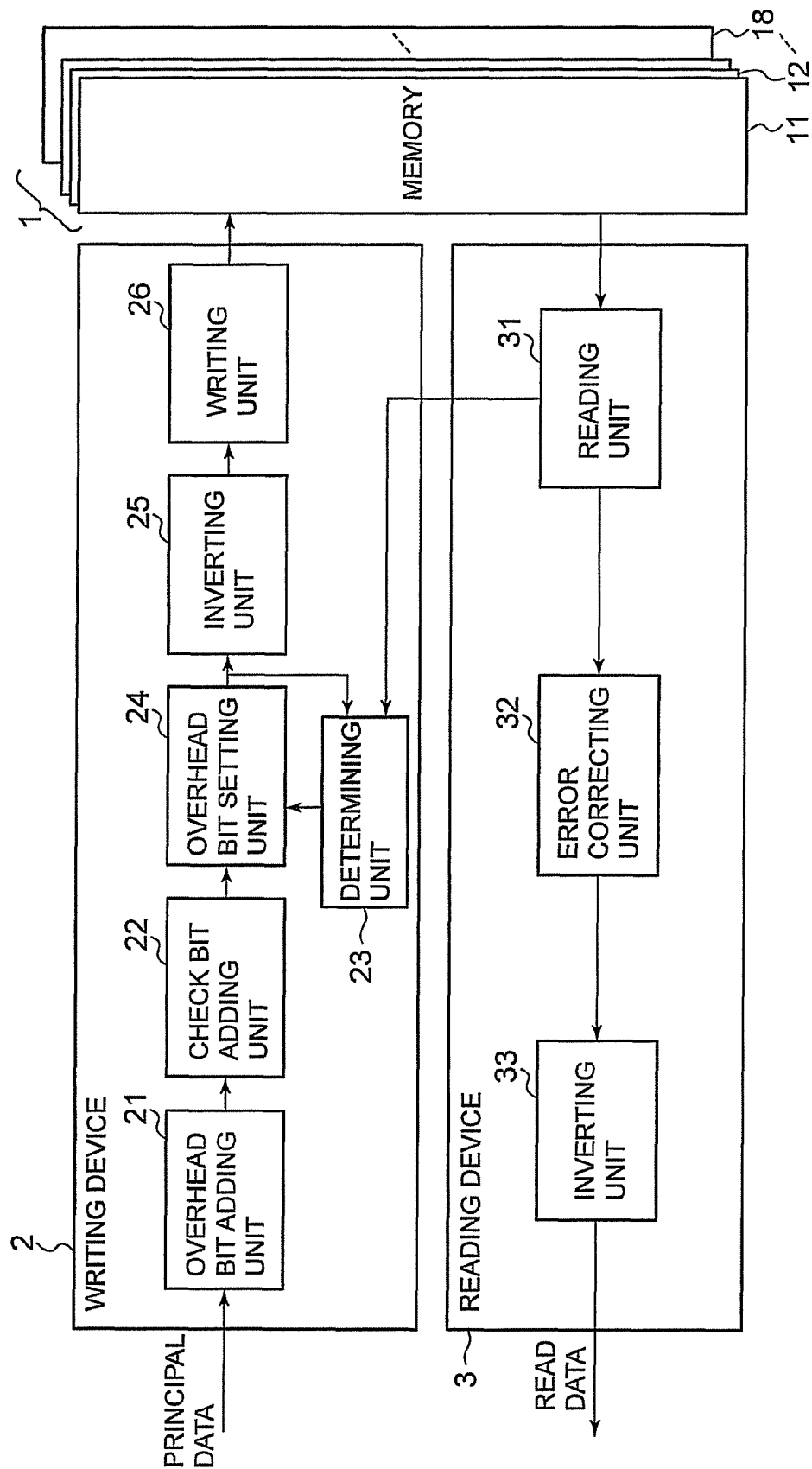
FIG. 12 is a block diagram of a memory device according to a modification.

In the above described second embodiment, the reading unit 27 is provided in the writing device 2, as shown in FIG. 7. However, the data read from the memory 1 by the reading unit 31 of the reading device 3 may be output to the determining unit 23, as shown in FIG. 12, and a check may be then made to determine whether the write data matches the read data.

In the example described in the above second embodiment, the overhead bit setting unit 24 first sets the overhead bits to "0." However, the overhead bits may be set so that the number of bits to be subjected to read disturb in each bit group becomes smaller.

In the writing device 2 according to each of the above described embodiments, the overhead bit adding unit 21 may be omitted, and the check bit adding unit 22 may also add the overhead bits.

In each of the above described embodiments, the number of pieces of data to be input to each XOR element is an even number in the syndrome calculating unit 50, as shown in FIGS. 4 and 11. This is because, if the number of pieces of data to be input to the XOR elements is an odd number, incorrect error detection is performed through syndrome calculations.

In each of the above described embodiments, the numbers of bits in the respective bit groups are the same. However, those numbers may vary. Also, principal data and check bits may belong to multiple bit groups. Further, some principal data and some check bits may not belong to any bit group.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory device comprising:
   a writing device that writes data bits, check bits for error corrections, and k (k being an integer equal to or greater than 1) overhead bit(s) into a memory, each bit of the k overhead bit(s) corresponding to each group of k bit group(s) including at least one bit of the data bits and/or the check bits, each bit of the k overhead bit(s) indicating whether the corresponding bit group has been inverted;
   a reading unit that reads the data bits, the check bits, and the overhead bit(s) from the memory;
   a correcting unit that corrects an error in the data bits and the overhead bit(s) read from the memory, based on the check bits read from the memory; and
   an inverting unit that inverts the data bits contained in the bit group corresponding to the overhead bit and outputs the inverted data bits as data read from the memory when the error-corrected overhead bit indicates that inversion has been performed, and does not invert the data bits contained in the bit group corresponding to the overhead bit and outputs the data bits as the data read from the memory when the error-corrected overhead bit indicates that inversion has not been performed.

2. The memory device according to claim 1, wherein the correcting unit includes a plurality of XOR elements that perform a syndrome calculation, each of the XOR elements receiving an even number of bits among the data bits, the check bits, and the overhead bit(s) read from the memory.

3. The memory device according to claim 2, wherein the writing device includes:
   a first adding unit that adds a k-bit predetermined value as the overhead bit(s) to the data bits;
   a second adding unit that calculates the check bits for performing an error correction on the overhead bit(s) and the data bits, and adds the check bits to the data bits;
   a determining unit that determines whether to invert the bit group;
   a setting unit that sets the overhead bit corresponding to the bit group determined to be inverted by the determining unit, to a value indicating that the bit group has been inverted, and sets the overhead bit corresponding to the bit group determined not to be inverted by the determining unit, to a value indicating that the bit group has not been inverted;
   a second inverting unit that inverts and outputs the bit group corresponding to the overhead bit set to the value indicating that the bit group has been inverted, and does not invert but outputs the bit group corresponding to the overhead bit set to the value indicating that the bit group has not been inverted; and a writing unit that writes the bit group output from the second inverting unit and the overhead bit corresponding to the bit group, into the memory.

4. The memory device according to claim 3, wherein
the writing device further includes a second reading unit that reads the data the writing unit has written into the memory,
the determining unit compares the data written by the writing unit with the data read by the second reading unit,
the setting unit re-sets the overhead bit corresponding to the bit group containing a bit exhibiting mismatching in the result of the comparison performed by the determining unit, to an inverted value,
based on the re-set overhead bit, the second inverting unit performs a re-inverting operation on the bit group corresponding to the overhead bit, and
the writing unit writes the re-set overhead bit and the re-inverted bit group into the memory.

5. The memory device according to claim 4, wherein
the memory includes k storage areas, and
the writing unit writes the $m_{th}$ overhead bit (m being one of successive integers in a range expressed as $1 \leq m \leq k$) and the bit group corresponding to the $m_{th}$ overhead bit into the $m_{th}$ storage area.

6. The memory device according to claim 3, wherein the determining unit counts the number of bits having a logical value "1" or "0" contained in each group of the k bit group(s), determines to invert each bit group having a count value equal to or greater than a predetermined value, and determines not to invert each bit group having the count value smaller than the predetermined value.

7. The memory device according to claim 3, wherein
the reading unit reads the data the writing unit has written into the memory, and outputs the data to the determining unit,
the determining unit compares the data written by the writing unit with the data read by the reading unit,
the setting unit re-sets the overhead bit corresponding to the bit group including a bit that exhibits mismatching in a result of the comparison performed by the determining unit, to an inverted value,
based on the re-set overhead bit, the second inverting unit performs a re-inverting operation on the bit group corresponding to the overhead bit, and
the writing unit writes the re-set overhead bit and the re-inverted bit group into the memory.

* * * * *